US010757835B2

United States Patent
Ware et al.

(10) Patent No.: US 10,757,835 B2
(45) Date of Patent: Aug. 25, 2020

(54) COOLING TECHNOLOGY FOR CRYOGENIC LINK

(71) Applicant: Rambus Inc., Sunnyvale, CA (US)

(72) Inventors: Frederick A. Ware, Los Altos Hills, CA (US); Carl W. Werner, Los Gatos, CA (US)

(73) Assignee: RAMBUS INC., San Jose, CA (US)

(*) Notice: Subject to any disclaimer, the term of this patent is extended or adjusted under 35 U.S.C. 154(b) by 206 days.

(21) Appl. No.: 15/783,949

(22) Filed: Oct. 13, 2017

(65) Prior Publication Data

US 2018/0168070 A1    Jun. 14, 2018

Related U.S. Application Data

(60) Provisional application No. 62/477,878, filed on Mar. 28, 2017, provisional application No. 62/432,508, filed on Dec. 9, 2016.

(51) Int. Cl.
*H05K 7/20* (2006.01)
*G06F 1/20* (2006.01)
(Continued)

(52) U.S. Cl.
CPC .......... *H05K 7/20372* (2013.01); *G06F 1/18* (2013.01); *G06F 1/20* (2013.01); *G06F 1/206* (2013.01); *H01B 7/04* (2013.01); *H01B 7/29* (2013.01); *H01L 23/3677* (2013.01); *H01L 23/49888* (2013.01); *H01L 23/522* (2013.01);
(Continued)

(58) Field of Classification Search
CPC ........ H05K 1/20372; H01B 7/04; H01B 7/29; H01B 27/108; H01B 23/53285; H01B 23/49888; H01B 23/522; H01B 23/3677; H01B 23/5387; H01B 3/12
See application file for complete search history.

(56) References Cited

U.S. PATENT DOCUMENTS 6,222,113 B1 * 4/2001 Ghoshal .................. H01L 35/32
                                                          136/201
6,384,312 B1 * 5/2002 Ghoshal .................. H01L 35/30
                                                          136/203
(Continued)

OTHER PUBLICATIONS

David B. Tuckerman "Flexible superconducting Nb transmission lines on thin film polyimide for quantum computing applications" arXiv: 1606.04557 V1 [cond-mat.supr-con] Jun. 14, 2016.
(Continued)

*Primary Examiner* — Kun Kai Ma
(74) *Attorney, Agent, or Firm* — Lowenstein Sandler LLP

(57) ABSTRACT

The embodiments herein describe technologies of cryogenic digital systems with a first component located in a first cryogenic temperature domain and a second component located in a second cryogenic temperature domain that is lower in temperature than the first cryogenic temperature domain. An electrical conductor is coupled between the first component and the second component along a first plane. The electrical conductor carries a signal between the first component and the second component. A cooling assembly is coupled to a segment of the electrical conductor. The cooling assembly may include an electrical insulator including ceramic material. The cooling assembly may include a cold plate, two cold plates, or an orthogonal cold strip.

19 Claims, 7 Drawing Sheets

(51) Int. Cl.

| | |
|---|---|
| *H01L 27/108* | (2006.01) |
| *G06F 1/18* | (2006.01) |
| *H01B 7/29* | (2006.01) |
| *H01B 7/04* | (2006.01) |
| *H01L 23/522* | (2006.01) |
| *H01L 23/532* | (2006.01) |
| *H01L 23/367* | (2006.01) |
| *H01L 23/498* | (2006.01) |
| *H01B 3/12* | (2006.01) |
| *H01B 1/02* | (2006.01) |
| *H01L 23/538* | (2006.01) |

(52) U.S. Cl.
CPC ...... *H01L 23/53285* (2013.01); *H01L 27/108* (2013.01); *H01B 1/026* (2013.01); *H01B 3/12* (2013.01); *H01L 23/5387* (2013.01)

(56) References Cited

U.S. PATENT DOCUMENTS

| | | | | |
|---|---|---|---|---|
| 6,639,242 B1* | 10/2003 | Chen | ............ | H01L 23/38 257/12 |
| 9,520,180 B1* | 12/2016 | Mukhanov | ............ | G11C 11/18 |
| 9,627,717 B1* | 4/2017 | Langlois | ............ | H01M 6/188 |
| 2004/0082482 A1* | 4/2004 | Rey | ............ | H01B 1/08 505/100 |
| 2007/0290287 A1* | 12/2007 | Freedman | ............ | B82Y 30/00 257/443 |
| 2011/0121366 A1* | 5/2011 | Or-Bach | ............ | H01L 21/6835 257/204 |
| 2013/0258595 A1 | 10/2013 | Tuckerman | | |
| 2014/0103414 A1* | 4/2014 | Koldiaev | ............ | H01L 27/1203 257/296 |
| 2014/0362652 A1* | 12/2014 | Luo | ............ | H01L 27/1052 365/191 |
| 2016/0336503 A1* | 11/2016 | Kasichainula | ............ | H01L 35/08 |
| 2017/0370776 A1* | 12/2017 | Kangas | ............ | B01D 5/0051 |
| 2018/0166120 A1* | 6/2018 | Ware | ............ | G06F 11/10 |
| 2019/0221238 A1* | 7/2019 | Tseng | ............ | G11C 11/404 |

OTHER PUBLICATIONS

Manheimer, Marc, "Cryogenic Computing Complexity (C3)", Office of the Director of National Intelligence, Intelligence Advanced Research Projects Activity (IARPA), ASC 2014, Aug. 2014, pp. 1-20. 20 pages.

Reilly, David, "Towards Control of a Large-Scale Quantum Computer", 15th Annual Microsoft Research Faculty Summit 2014. 31 pages.

Rujun Bai et al, "Microwave Loss Measurements of Copper-Clad Superconducting Niobium Microstrip Resonators on Flexible Polyimide Substrates", IEEE Transactions on applied Superconductivity, vol. 27 No. 4 Jun. 2017.

\* cited by examiner

COOLING TECHNOLOGY FOR CRYOGENIC LINK

RELATED APPLICATION

This application claims the benefit of U.S. Provisional Application No. 62/477,878, filed Mar. 28, 2017 and 62/432,508, filed Dec. 9, 2016, the entire contents of both are hereby incorporated by reference.

BACKGROUND

Cryogenic digital systems can be used in electronic systems that require voltage and current to be transferred from one temperature domain to a lower temperature domain. For example, the electronic system may include a first temperature domain at 300 Kelvin (K) and a second temperature domain at 4K. There are other temperature domains that may be used as the second temperature domain, such as 17 K. Copper conductors are used to transfer the voltage and current between components in the temperature domains. The voltage and current on the copper conductors contribute heat into the low temperature domain using two mechanisms: a first mechanism is thermal conduction and the other mechanism is electrical heating.

Heat flow to the second temperature domain in a cryogenic digital system is a concern. There is a huge efficiency factor that has to be applied to calculate the amount of energy at room temperature to pull the heat out at a second cryogenic temperature domain, such as by a cooling subsystem. Also, when using a link between one temperature domain and another temperature domain, a signal on a segment of the link in the one temperature domain may be superconducting and the signal on a segment of the link in the other temperature domain may be conducting (also referred as normal conduction).

BRIEF DESCRIPTION OF THE DRAWINGS

The present disclosure is illustrated by way of example, and not by way of limitation, in the figures of the accompanying drawings.

DETAILED DESCRIPTION

The embodiments herein describe technologies of cryogenic digital systems with a first component, like a memory subsystem, in a first cryogenic temperature domain (e.g., 77K) and a second component, like a processor, in a second cryogenic temperature domain (e.g., 4K) that is less than the first cryogenic temperature. A pair of conductors carries current with a voltage difference between the first component and the second component. A pair of conductors may be referred to as a link to carry a signal between the first component and the second component. For example, the signal can be sent from a transmitter to a receiver over the link. The transmitter (or other signal generator) can be part of a first component, such as a memory controller, and the receiver can be part of a second component, such as a memory device. The embodiments described herein describe multi-conductor signal links, but other types of interconnections between circuit elements in the first component and circuit elements in the second component may be used. In one embodiment, a cryogenic electronic system may be a memory system with a memory component in a first cryogenic temperature domain and a controller component in a second cryogenic temperature that is lower than the first cryogenic temperature domain. Signals are carried between the memory component and the controller component on at least one link. In one of the temperature domains, the link is superconducting and the link is clamped at an appropriate temperature value by one of the various embodiments described herein. For example, in one embodiment, the link can be claimed at the appropriate temperature value by a cold strip that is orthogonal to a link direction of the link, the cold strip being separated from the link by an interposer material with low electrical conductivity, high thermal conductivity, as described below with respect to FIGS. 4-5. In another embodiment, the link can be claimed at the appropriate temperature value by a cold plate covering the link in the lower temperature domain, the cold plate being built from material having low electrical conductivity, high thermal conductivity, as described below with respect to FIG. 6. Alternatively, the link can be claimed at the appropriate temperature value by other technologies as described herein.

It should be noted that the U.S. National Institute of Standards and Technology defines cryogenic temperatures as being temperatures below 93.15 K (−180° Celsius, −292° Fahrenheit), however, other have defined cryogenic temperatures as being below 123 K. In some embodiments, both the first component and the second component are in different cryogenic temperature domains, but in other embodiments, the first component may be in a cryogenic temperature domain and the second component may be in a temperature domain above cryogenic temperatures.

Figure 1:
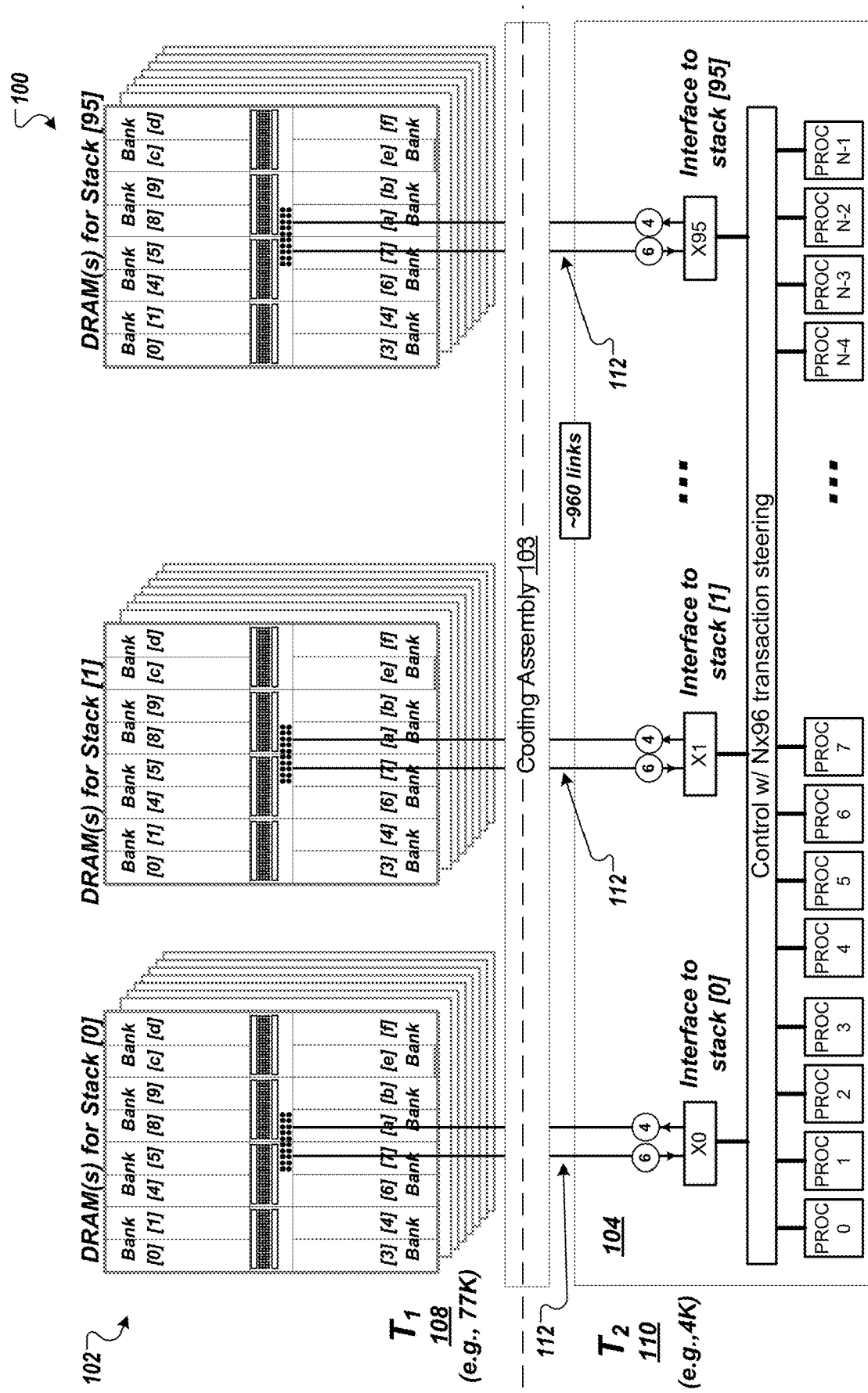
FIG. 1 is a block diagram of a cryogenic digital system with a memory subsystem, a processing system, and a cooling assembly according to one embodiment.

FIG. 1 is a block diagram of a cryogenic digital system 100 with a memory subsystem 102, a processing system 104, and a cooling assembly 106 according to one embodiment. The cryogenic digital system 100 includes a first cryogenic temperature domain 108 ($T_1$) and a second cryogenic temperature domain 110 ($T_2$). The first cryogenic temperature domain 108 ($T_1$) may be 77K. In another embodiment, the first cryogenic temperature domain 108 ($T_1$) is approximately 77K or above and the second cryogenic temperature domain 110 ($T_2$) is less than 77K. Alternatively, other cryogenic and non-cryogenic temperatures may be used for the first cryogenic temperature domain 108 ($T_1$). The memory subsystem 102 is located in the first cryogenic temperature domain 108 ($T_1$). The memory subsystem 102 includes multiple stacks of multiple Dynamic Random Access Memory (DRAM) devices. Multiple DRAM devices can be disposed on one or more substrates. The second cryogenic temperature domain 110 ($T_2$) maybe 4K. Alternatively, other cryogenic and non-cryogenic temperatures may be used for the second cryogenic temperature domain 110 ($T_1$). The processing system 104 is located in the second cryogenic temperature domain 110 ($T_1$). The processing system 104 may include any type of electronic component or integrated circuit device or devices. In the depicted embodiment, the processing system 104 may include multiple interfaces to the multiple stacks in the memory subsystem 102, multiple processor cores, and transaction steering logic coupled between the interfaces and the processor cores. In one embodiment, the interfaces of the processing system are coupled to the memory subsystem 102 via multiple links, such as 960 links. Although the processing system 104 is illustrated with multiple processor cores, in other embodiments, the processing system may be a single processor, a System on Chip (SoC) device including one or more cores, a controller, or other types of processing devices. As referred to herein, the processing system 104 is referred to as the second component in the second cryogenic temperature domain and is intended to include or be representative of any type of integrated circuit component including, for example and without limitation, integrated circuit devices or buffer/bridge devices having high speed serial links, chips such as processors, system on chip (SOC), field programmable gate arrays (FPGA), application specific integrated circuits (ASIC), or the like. As referred to herein, the memory subsystem 102 is referred to as the first component in the first cryogenic temperature domain and is intended to include or be representative of any type of integrated circuit component including, for example and without limitation, integrated-circuit memory devices of various types (e.g., dynamic random access memory (DRAM), static random access memory (SRAM), and any of the numerous types of non-volatile memory, including Flash memory, phase-change memory, magneto-resistive memory, etc.), integrated-circuits having a memory control function (e.g., dedicated memory controllers, processors, chipset components, etc.) or any other type of integrated circuit device in the first temperature domain.

As illustrated in FIG. 1, links 112 are coupled between the memory subsystem 102 in the first cryogenic temperature domain 108 ($T_1$) and the processing system 104 in the second cryogenic temperature domain 110 ($T_2$). Each link may be a pair of conductors (or a single conductor) on which a signal is carried between the memory subsystem 102 and the processing system 104. It should be noted that although various embodiments described herein are described as a pair of conductors, the embodiments also apply to a single conductor, like a wire. It should be noted that a return path (e.g., via a ground plane) could be shared by other single conductors. A cooling assembly 106 is coupled to the links 112. Additional details of the cooling assembly 106 are described in more detail below with respect to FIGS. 2-6. In some embodiments, the links 112 are part of flex cable interconnection, such as illustrated and described with respect to FIG. 2.

In one embodiment, the processing system 104 and the memory subsystem 102 are part of a cryogenic computer. In some cases, the cryogenic computer, using various embodiments of the cooling assembly 106 as described herein, is designed to achieve 0.1 pico-Joules per bit (pJ/b) energy efficiency. Alternatively, other energy efficiency numbers can be achieved. In one implementation, the cold memory subsystem is designed to have a power of 1 W (energy/bit with 0.1 pJ/b), a cost per bit (Cost/bit) less than 1.4× standard 8/16 Gb core, an access latency less than 1.4 standard 8/16 Gb core, 786 GB in capacity, and a bandwidth of 1 TB/s. The memory subsystem can have 64B access granularity. In some implementations, a link swing can be approximately 12 mV and the link count can be between 1000-2000 links. Alternatively, other design considerations can be used for the cold memory subsystem. It should be noted that in some cases the processing system 104 can include a transmitter (e.g., a memory controller) that sends a signal to a receiver in the memory subsystem 102 over a link, such as in a write operation. Alternatively, the memory subsystem 102 includes a transmitter that sends a signal to a receiver in the processing system 104 over a link, such as in a read operation.

Figure 2:
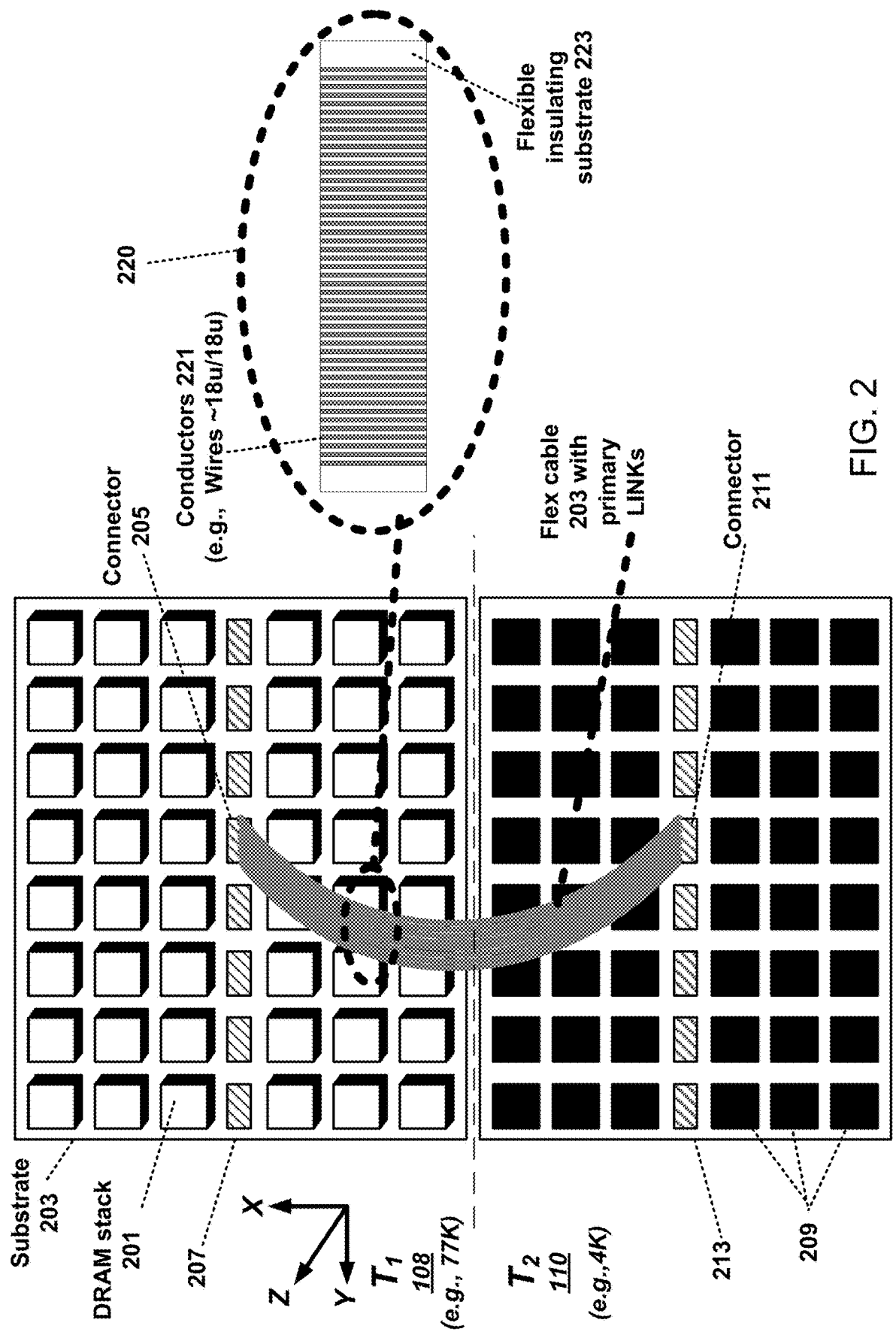
FIG. 2 is a block diagram of a cryogenic digital system with a memory subsystem, a processing system, and a flex cable interconnection upon which a cooling assembly is disposed according to one embodiment.

FIG. 2 is a block diagram of a cryogenic digital system 200 with a memory subsystem 202, a processing system 204, and a flex cable interconnection 202 upon which a cooling assembly is disposed according to one embodiment. Although the cooling assembly is not illustrated in FIG. 2, the various embodiments described herein may be coupled to the flex cable interconnection 202. The memory subsystem 202 includes multiple DRAM stacks 201 disposed on a front surface of a substrate 203. The DRAM stacks 201 are coupled to a connector 205 in an interface region 207 on the front surface of the substrate 203. The processing system 204 includes one or more integrated circuits 209, such as processors, processor cores, SoCs, or the like. The integrated circuits 209 are coupled to a connector 211 in an interface region 213 on the front surface of the substrate 203. The flex cable interconnection 202 is coupled between the connector 205 and the connector 211. In the depicted embodiment, as illustrated in the expanded view 220 of a segment of the flex cable interconnection 202, the flex cable interconnection 202 includes multiple conductors 221 disposed on a flexible insulating substrate 223. The conductors 221 can be conductive traces printed on the flexible insulating substrate 223 or wires embedded within the flexible insulating substrate 223. In some cases, the a pair of the conductors 221 forms a link and the flex cable interconnection 202 includes multiple links, including links for data signals and links for control signals. In one implementation, the flex cable interconnection 202 includes 18 data links and 29 control links (e.g., D[17:0] and Q[28:0]). For example, the D[17:0] links may carry write data and control/command/address information and the Q[28:0] links may carry read data and status information. Alternatively, other arrangements are possible. It should also be noted that the links may be unidirectional links or bi-directional links. The links can operate with 2 Gb/s data rate. Alternatively, other data rates may be used for the links.

As described herein, since the DRAM stacks 201 are located in a first temperature domain, such as 77K, and the integrated circuits 209 are located in a second temperature domain, such as 4K, the flex cable interconnection 202 straddles the two temperature domains with one segment being in the first temperature domain and another segment being in the second temperature domain that is lower than the first temperature domain. The segment in the second temperature domain can be a superconducting segment and the other segment in the first temperature domain can exhibit normal conduction. In order to maximize the superconducting segment of the flex cable interconnection 202 to minimize attenuation, the cooling assembly can be coupled to the flex cable interconnection, such as illustrated with cold plates in FIGS. 3 and 6, cold strips in FIGS. 4 and 5.

Figure 3:
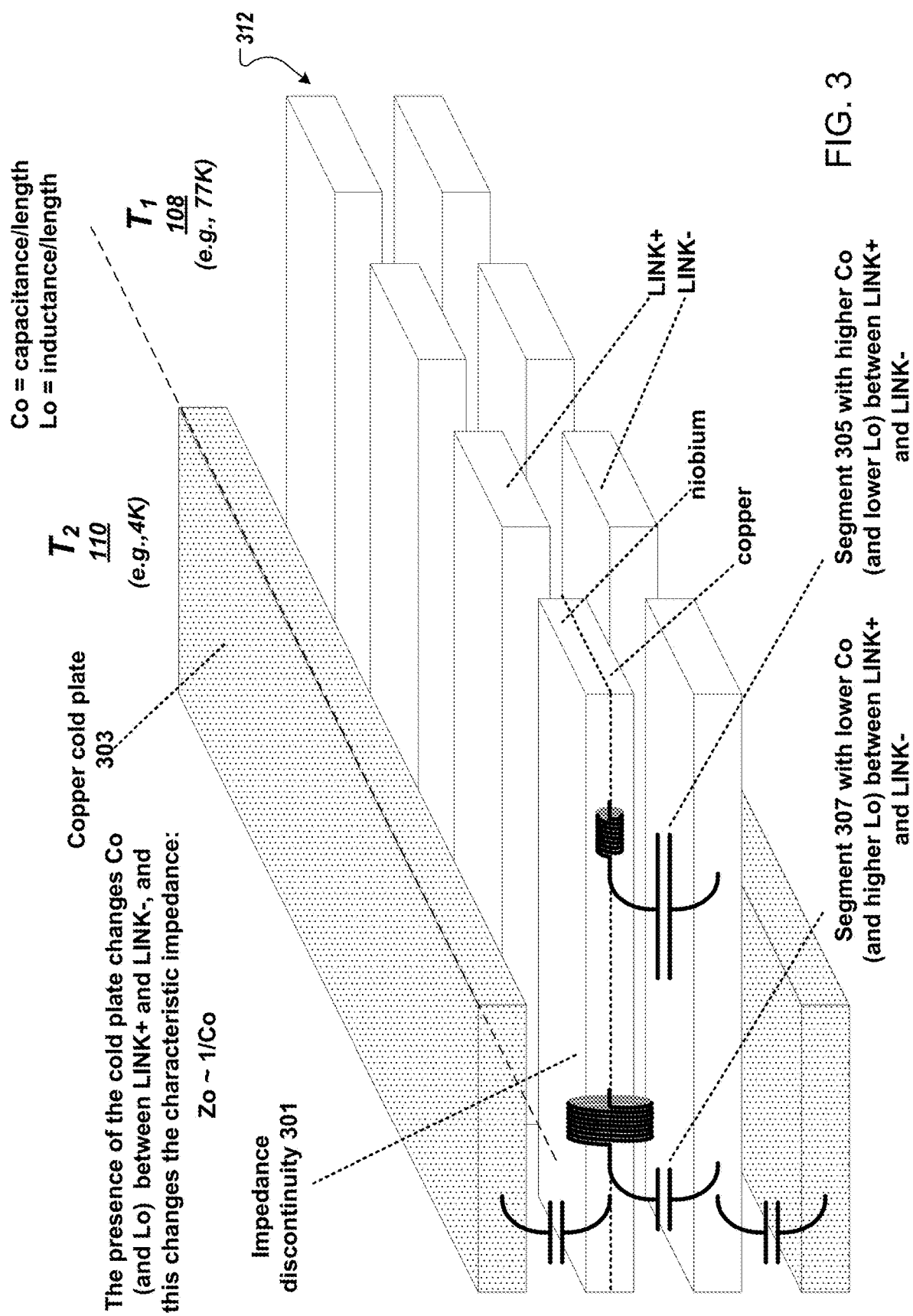
FIG. 3 illustrates four electrical conductor pairs of the flex cable interconnection with a cold plate according to one implementation.

FIG. 3 illustrates four electrical conductor pairs of the flex cable interconnection with a cold plate 303 according to one implementation. In this implementation, the flex cable interconnection is represented as four pairs of conductors that form four links 312. However, the flex cable interconnection can have more or less pairs than four. Each of the four links 312 includes a first conductor, labeled LINK+, and a second conductor, labeled LINK−. The cold plate 303 is coupled to the links 312 to thermally clamp the links 312 to the second cryogenic temperature domain (4K). The cold plate 303 can be made of copper and the conductors can be made of a combination of copper and niobium. There is a temperature gradient from 4K to 77K on the links. The links are superconducting below a critical threshold temperature and exhibit classical conduction otherwise. With dynamic power dissipation in the two temperature domains, the interface region may be variable. The presence of the copper cold plate 303 changes a characteristic impedance $$\left(Zo \sim \frac{1}{\sqrt{Co}}\right)$$

of the links 312. In particular, the presence of the copper cold plate 303 changes a capacitance per unit length (Co) and an induction per unit length (Lo), causing impedance discontinuity 301 in the links 312

$$\left(\text{e.g., } Z = \sqrt{\frac{L}{C}},\right.$$

where Z is the impedance of the link. For example, in the first temperature domain (77K) there is a segment 305 (or region) of the link with a higher capacitance per unit length (Co) (and lower inductance per unit length (Lo)) between a pair of conductors and, in the second temperature domain (4K) there is another segment 307 (or region of the link) with a lower Co (and higher Lo) between the pair of conductors. The impedance discontinuity 301 causes a reflection of a bit signal when carried on the link, possibly interfering with a subsequent bit signal subsequently carried on the link.

Various embodiments, such as those described below with respect to FIGS. 4-6, can be used to reduce the reflection of the bit signal when carried on the link to avoid interfering with a subsequent bit signal subsequently carried on the link.

Figure 4:
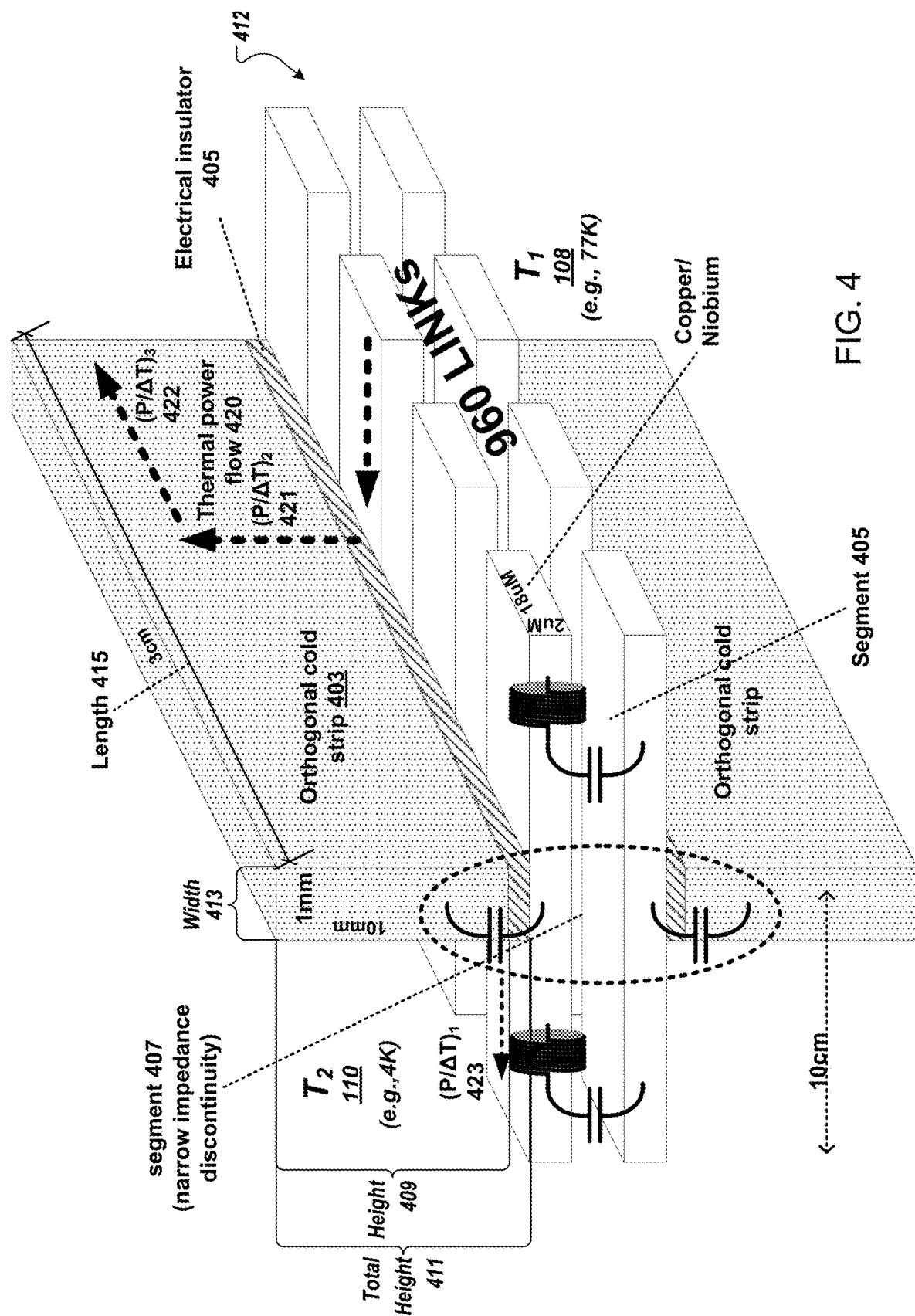
FIG. 4 illustrates four electrical conductor pairs of the flex cable interconnection with an orthogonal cold strip according to one embodiment.

FIG. 4 illustrates four electrical conductor pairs of the flex cable interconnection with an orthogonal cold strip 403 according to one embodiment. In this embodiment, the flex cable interconnection is represented as four pairs of conductors that form four links 412. However, the flex cable interconnection can have more or less pairs than four. Each of the four links 412 includes a first conductor, labeled LINK+, and a second conductor, labeled LINK−. The orthogonal cold strip 403 is coupled to the links 412 to thermally clamp the links 412 to the second cryogenic temperature domain (4K). The orthogonal cold strip 403 can be made of copper and the conductors can be made of a combination of copper and niobium. The combination of copper and niobium has superconduction in 4K domain and normal conduction in 77K domain (and in the interface region). The presence of the orthogonal cold strip 403, as compared to the cold plate 303 of FIG. 3, may change the characteristic impedance $$\left(Zo \sim \frac{1}{\sqrt{Co}}\right)$$

of the links 412, but the segment 407 with impedance discontinuity is narrower in the links 412 than the segment with impedance discontinuity in the links 312. The narrower segment creates a smaller reflection, which may cause less interference with subsequent bit signals. For example, in the first temperature domain (77K) there is a segment 401 (or region) of the link with a higher capacitance per unit length (Co) (and lower inductance per unit length (Lo)) between a pair of conductors and, in the second temperature domain (4K) there is another segment 407 (or region of the link) with a lower Co (and higher Lo) between the pair of conductors. However, the relative dimensions of the orthogonal cold strip 403 reduce a segment 407 of the link (electrical conductor pair) with impedance discontinuity, creating a smaller reflection of a signal, which reduces interference with subsequent bit signals. That is the segment with impedance discontinuity is narrower than a larger cold plate, as illustrated in FIG. 3.

In the depicted embodiment, an electrical insulator 405 is coupled to the segment 407 of links 412 and the orthogonal cold strip 403. The electrical insulator 405 may be used for mechanical connection of the conductor of the link 412 and the orthogonal cold strip 403. For example, the electrical insulator 405 can be bonded with adhesive or can be mechanically attached in between the conductors. The electrical insulator 405 that is coupled to the conductor may be a sheet or a trace in parallel or in a parallel plane to the conductor. The links 412 are disposed along a first plane between a first component in the first temperature domain (77K) and a second component in the second temperature domain (4K). The links 412 are electrical conductor pairs coupled between the first component and the second component, and each of the links 412 carries a signal between the first component and the second component. A height 409 of the orthogonal cold strip 403 is orthogonal to the first plane in which the links 412 (electrical conductor pairs) are disposed. A total height 411 of the orthogonal cold strip 403 and the electrical insulator 405 is greater than a width 413 of the orthogonal cold strip 403 (and a width of the electrical insulator 405). The orthogonal cold strip 403 has a length 415 that extends from a first side of the links 412 to a second side of the links 412. For example, in on implementation, the height 409 is 10 mm, the width 413 is 1 mm, and the length 415 can be 3 cm. The conductors can each be 2×18 microns (uM). Alternatively, the conductors can be other dimensions and the number of links 412 can determine the length 415 of the orthogonal cold strip 403. In one embodiment, the orthogonal cold strip 403 can be disposed 10 cm from a first end of the links 412, the first end being the end in the second temperature domain (4K).

In the depicted embodiment, virtually all of the thermal power will flow through the orthogonal cold strip 403 and the links 412 will be clamped at the second temperature domain (4K). For example, a thermal power flow 420 through the orthogonal cold strip 403 includes a vertical flow 421 and a horizontal flow. The vertical flow 421 can be expressed in the following equation:

$(P/\Delta T)_2 = \lambda * A/L,$ where $\lambda$ is the thermal conductivity coefficient, A is the cross sectional area (width times length), and L is the height. For the dimensions described above and the material of the orthogonal cold strip 403 being copper, the vertical flow 421 can be calculated as follows:

$(P/\Delta T)_2 = (385 \text{ W/M-K}) * (1 \text{ mm}) * (3 \text{ cm})/10 \text{ m}$ $(P/\Delta T)_2 = (1.155 \text{ W/K}).$ The horizontal flow 422 can be express in the following equation:

$$(P/\Delta T)_{23} = \lambda * A/L,$$

where λ is the thermal conductivity coefficient, A is the cross sectional area (width times height), and L is the length. For the dimensions described above and the material of the orthogonal cold strip 403 being copper, the horizontal flow 422 can be calculated as follows:

$$(P/\Delta T)_3 = (385 \text{ W/M-K}) * (1 \text{ mm}) * (10 \text{ mm})/3 \text{ cm}$$

$$(P/\Delta T)_3 = (0.13 \text{ W/K}).$$

The thermal power flow 420 can be express in the following equation:

$$(P/\Delta T)_{23} = (P/\Delta T)_2 * (P/\Delta T)_3 / [(P/\Delta T)_2 + (P/\Delta T)_3]$$

For the dimensions described above and the material of the orthogonal cold strip 403 being copper, the thermal power flow 420 can be calculated as follows:

$$(P/\Delta T)_{23} = (0.115 \text{ W/K}).$$

The resulting thermal power flow 423 in the second temperature domain (e.g., 10 cm from a first side of the orthogonal cold strip 403, the first side facing the first temperature domain) can be expressed in the following equation:

$$(P/\Delta T)_1 = \lambda * A/L$$

For the dimensions described above and the material of the orthogonal cold strip 403 being copper, the resulting thermal power flow 423 can be calculated as follows:

$$(P/\Delta T)_1 = (385 \text{ W/M-K}) * (18 \text{ um}) * (2 \text{ um})/10 \text{ cm}$$

$$(P/\Delta T)_1 = (1.39 * 10{-7} \text{ W/K}) \text{ per LINK}$$

$$(P/\Delta T)_1 = (1.33 * 10{-4} \text{ W/K}) \text{ for 960 LINKs}$$

$$(P/\Delta T)_{23} \sim 10^3 * (P/\Delta T)_1$$

As such, virtually all the thermal power will flow through the orthogonal cold strip 403, and the links 412 will be clamped at the second temperature domain (4K).

In one embodiment, the orthogonal cold strip 403 includes a conductive material, such as copper, and the electrical insulator 405 includes a ceramic material, such as Beryllium oxide (BeO), Alumina ($Al_2O_3$), or Aluminum Nitride (AlN), or the like. The links 412 may be made of copper, a combination of copper and niobium, or the like. As described above, the combination of copper and niobium has superconduction in 4K domain and normal conduction in 77K domain (and in the interface region).

In the depicted embodiment, the electrical insulator 405 is relatively smaller in height than the height 409 of the orthogonal cold strip 403. That is the height 409 of the orthogonal cold strip 403 is greater than the height of the electrical insulator 405. In other embodiment, other dimensions of both the orthogonal cold strip 403 and the electrical insulator 405 can be used. For example, a height of the electrical insulator 405 can be greater than the height 409 of the orthogonal cold strip 403, such as illustrated and described with respect to FIG. 5.

Figure 5:
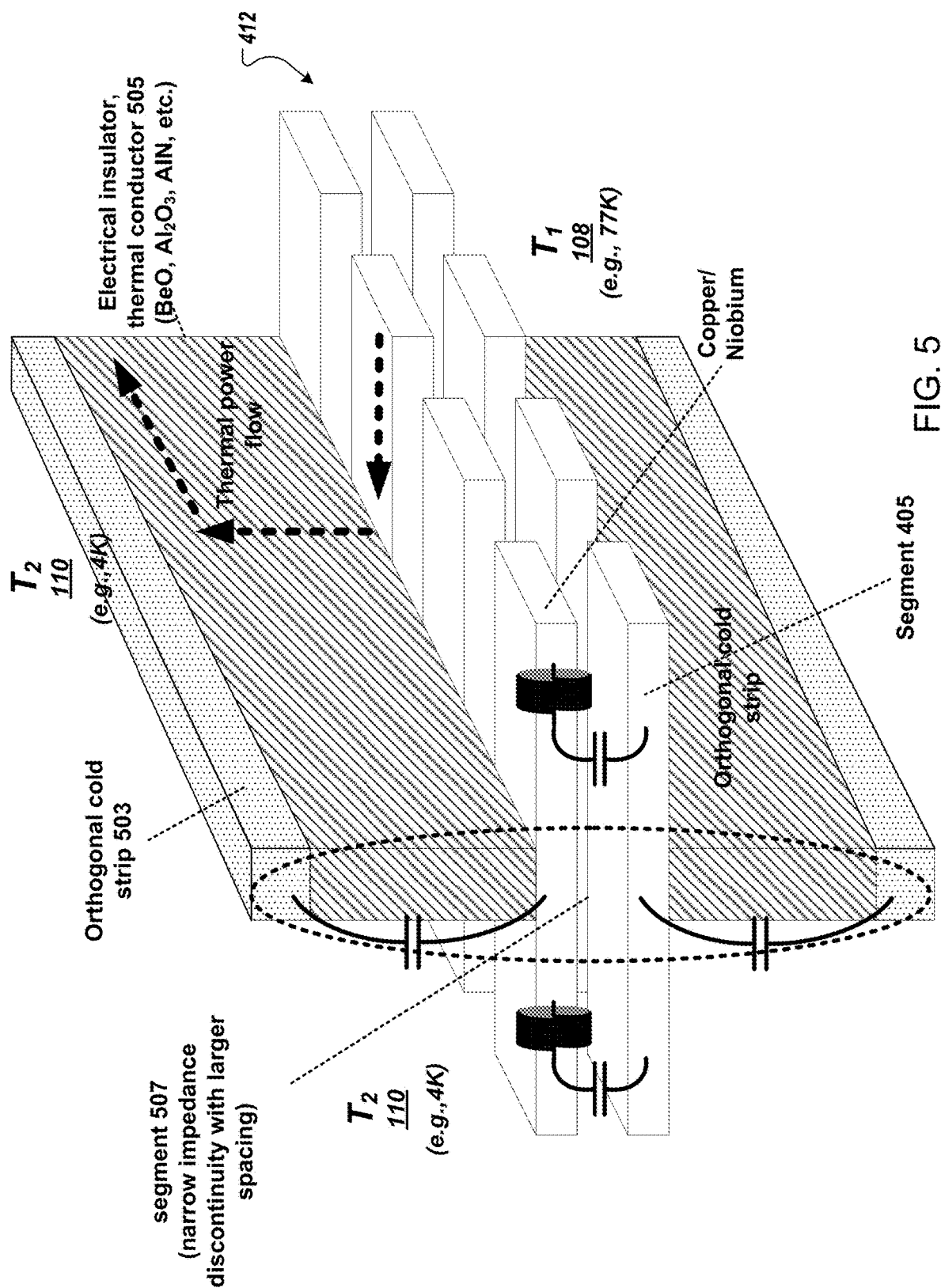
FIG. 5 illustrates four electrical conductor pairs of the flex cable interconnection with an orthogonal cold strip according to another embodiment.

FIG. 5 illustrates four electrical conductor pairs of the flex cable interconnection with an orthogonal cold strip 503 according to another embodiment. The flex cable interconnection of FIG. 5 is similar to the flex cable interconnection of FIG. 4 as noted by similar reference labels. The orthogonal cold strip 503 is coupled to the links 412 to thermally clamp the links 412 to the second cryogenic temperature domain (4K). The orthogonal cold strip 503 can be made of copper and the conductors can be made of a combination of copper and niobium. The combination of copper and niobium has superconduction in 4K domain and normal conduction in 77K domain (and in the interface region). The presence of the orthogonal cold strip 503, as compared to the cold plate 303 of FIG. 3, may change the characteristic impedance $$\left(Zo \sim \frac{1}{\sqrt{Co}}\right)$$

of the links 412, but the segment 507 with impedance discontinuity is narrower in the links 412 than the segment with impedance discontinuity in the links 312. The narrower segment creates a smaller reflection, which may cause less interference with subsequent bit signals. For example, in the first temperature domain (77K) there is the segment 401 (or region) of the link with a higher capacitance per unit length (Co) (and lower inductance per unit length (Lo)) between a pair of conductors and, in the second temperature domain (4K) there is another segment 407 (or region of the link) with a lower Co (and higher Lo) between the pair of conductors. However, the relative dimensions of the orthogonal cold strip 503 reduce a segment 507 of the link (electrical conductor pair) with impedance discontinuity, creating a smaller reflection of a signal received from a transmitter (or other signal generator), which reduces interference with subsequent bit signals. That is the segment 507 with impedance discontinuity is narrower than a larger cold plate, as illustrated in FIG. 3. It should be noted that changing the width of the line and adding a cold plate changes the characteristic impedance of the line. Also, keeping the impedance constant can maximize the signal transfer in the link. The segment 507 may be similar to the segment 407 in FIG. 4, however, there is a larger spacing between the links 412 and the orthogonal cold strip 503 since the height of the electrical insulator, thermal conductor 505 is greater than the height of the electrical insulator 405 of FIG. 5. The larger spacing from the electrical insulator, thermal conductor 505 causes less additional capacitance at the segment 507, resulting in a smaller reflection and causing less interference with subsequent bit signals. As described herein, the transmitter can be part of the first component in the first temperature domain and can send the signals (data, control, command signals) to a receiver in the second component over the links.

In one embodiment, the orthogonal cold strip 503 includes a conductive material, such as copper, and the electrical insulator, thermal conductor 505 includes a ceramic material, such as Beryllium oxide (BeO), Alumina ($Al_2O_3$), or Aluminum Nitride (AlN), or the like. The links 412 may be made of copper, a combination of copper and niobium, or the like. As described above, the combination of copper and niobium has superconduction in 4K domain and normal conduction in 77K domain (and in the interface region).

The embodiments of FIGS. 4 and 5 illustrates an orthogonal cold strip having a width that is less than a height with varying heights of an intervening electrical insulator. In one embodiment, the electrical insulator and the orthogonal cold strip are configured to clamp the segment at the second temperature domain and reduce an impedance discontinuity of the electrical conductor pair, as compared to a presence of a cold plate with a width that is larger than the height as described herein.

In other embodiments, other cooling assemblies may be used, such as a cold plate of ceramic material with a width of the cold plate being greater than a height of the cold plate, such as illustrated and described below with respect to FIG. 6. The ceramic material has low electrical conductivity and high thermal conductivities that are comparable to copper. For example, the thermal conductivity of copper (Cu) is 385 W/M-K, whereas the thermal conductivity of the ceramic materials are as follows:

BeO→310 W/M-K
AlN→190 W/M-K
$Al_2O_3$→40 W/M-K

In one embodiment, the ceramic material has an electrical conductivity lower than copper (or other metals) and a thermal conductivity 40 watts per meter-kelvin or above.

Figure 6:
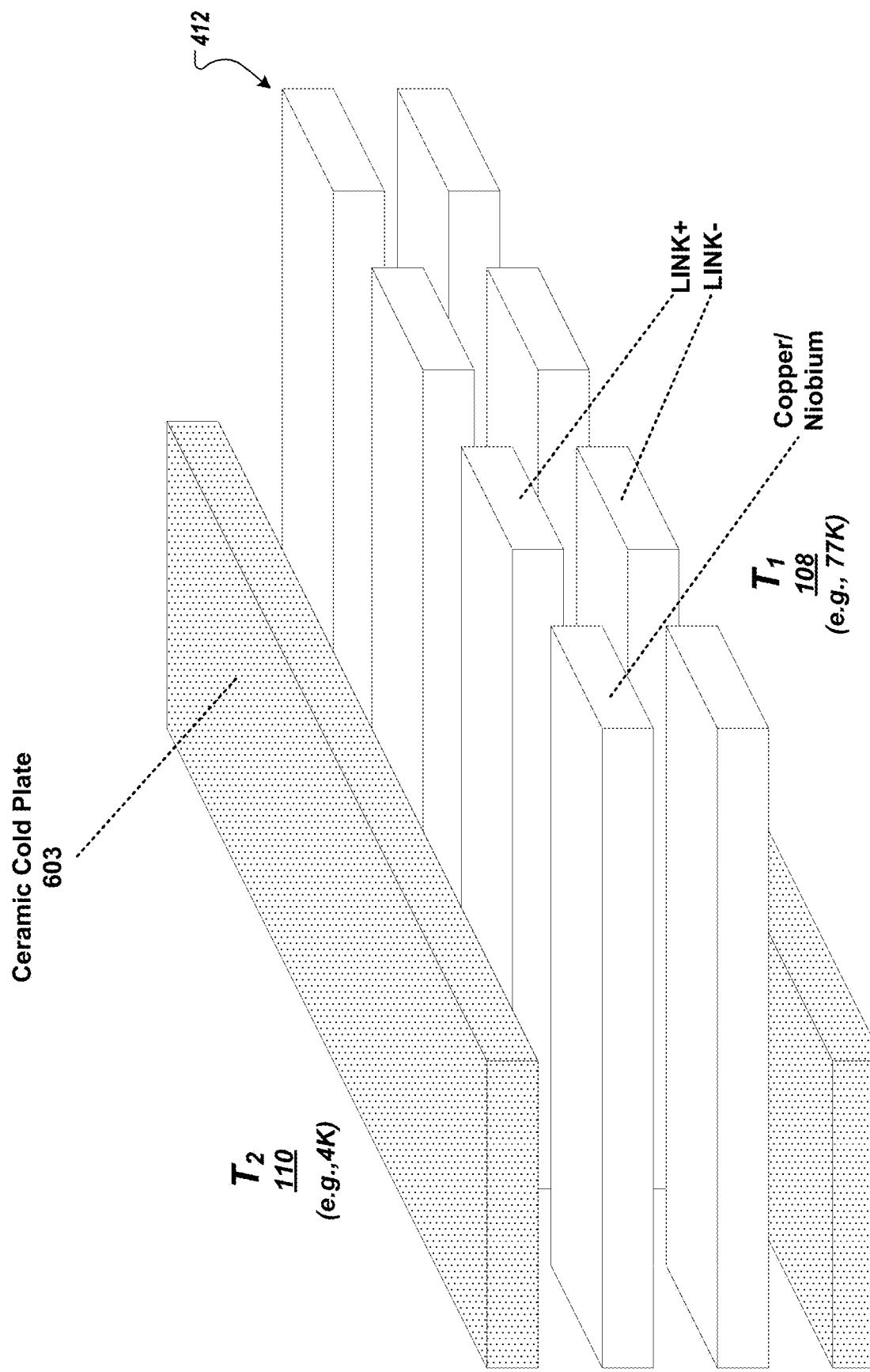
FIG. 6 illustrates four electrical conductor pairs of the flex cable interconnection with a ceramic cold plate according to one embodiment.

FIG. 6 illustrates four electrical conductor pairs of the flex cable interconnection with a ceramic cold plate 603 according to one embodiment. The flex cable interconnection of FIG. 6 is similar to the flex cable interconnection of FIG. 4 as noted by similar reference labels. The ceramic cold plate 603 is coupled to the links 412 to thermally clamp the links 412 to the second cryogenic temperature domain (4K). The ceramic cold plate 603 can be made of ceramic material having low electrical conductivity and high thermal conductivities that are comparable to copper. For example, the ceramic material may be BeO, $Al_2O_3$, AlN, or the like. The conductors can be made of a combination of copper and niobium. The combination of copper and niobium has superconduction in 4K domain and normal conduction in 77K domain (and in the interface region). The presence of the ceramic cold plate 603, as compared to the copper cold plate 303 of FIG. 3, does not dramatically change the characteristic impedance $$\left(Z_0 \sim \frac{1}{\sqrt{C_0}}\right)$$

of the links 412. The ceramic cold plate 603 maximizes the superconducting segment of the links 412, minimizing attenuation.

In another embodiment, a metal cold plate can be extended from the second temperature domain (4K) to the first temperature domain (77K). By extending the cold plate into the first temperature domain (77K), the impedance discontinuity may be addressed, but there may be a significant thermal leakage problem from the first temperature domain to the second temperature domain. In a further embodiment, an insulating region can be placed between two plates to minimize thermal leakage loss between the first temperature domain and the second temperature domain, such as illustrated and described below with respect to FIG. 7.

Figure 7:
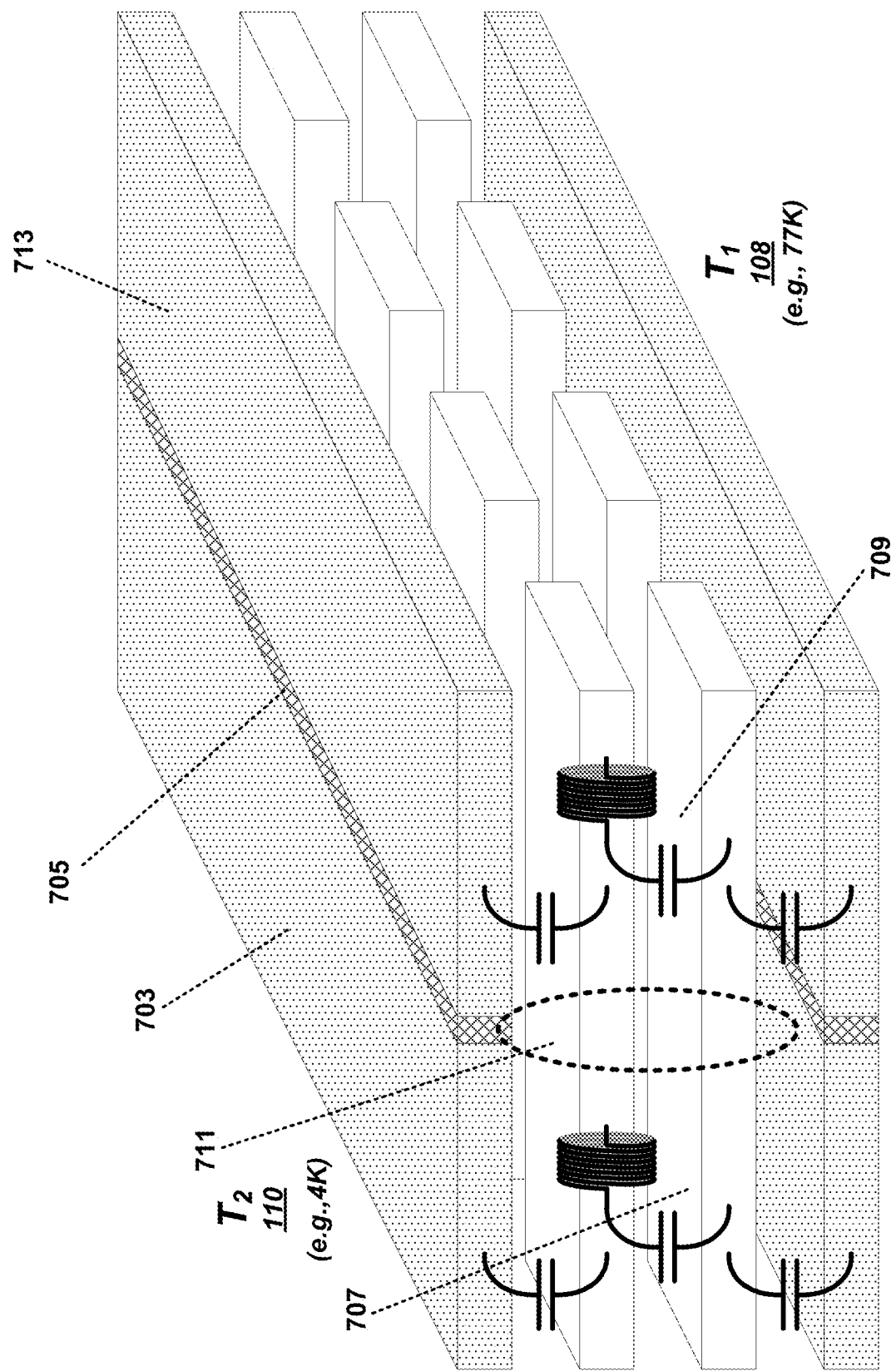
FIG. 7 illustrates four electrical conductor pairs of the flex cable interconnection with an insulating region placed between two cold plates according to one embodiment.

FIG. 7 illustrates four electrical conductor pairs of the flex cable interconnection with an insulating region 705 placed between two plates 703, 713 according to one embodiment. The flex cable interconnection of FIG. 7 is similar to the flex cable interconnection of FIG. 4 as noted by similar reference labels. The plate 703 can be considered a very cold plate (4K) and the plate 713 can be considered at cold plate 703 (77K). The two plates 703, 713 can be at fixed electrical potentials, such as local ground. The very cold plate 703 is coupled to the links 412 in a segment 707 to thermally clamp the links 412 to the second cryogenic temperature domain (4K). The very cold plate 703 can be made of metal, such as copper. The conductors can be made of a combination of copper and niobium. The combination of copper and niobium has superconduction in 4K domain and normal conduction in 77K domain (and in the interface region). The presence of the very cold plate 703, as compared to the copper cold plate 303 of FIG. 3, does not dramatically change the characteristic impedance $$\left(Z_0 \sim \frac{1}{\sqrt{C_0}}\right)$$

of the links 412 because of the presence of a second plate, the cold plate 713. The cold plate 713 is coupled to the links 412 in a segment 709 to thermally clamp the links 412 to the first cryogenic temperature domain (77K). The cold plate 713 can be made of metal, such as copper. The insulating region 705 is placed between the very cold plate 703 and the cold plate 713. The presence of the insulating region 705 may change the characteristic impedance $$\left(Z_0 \sim \frac{1}{\sqrt{C_0}}\right)$$

of the links 412, but a segment 711 with impedance discontinuity is narrower in the links 412 than the segment with impedance discontinuity in the links 312. The narrower segment creates a smaller reflection, which may cause less interference with subsequent bit signals. For example, in the first temperature domain (77K) there is a segment 401 (or region) of the link with a higher capacitance per unit length (Co) (and lower inductance per unit length (Lo)) between a pair of conductors and, in the second temperature domain (4K) there is another segment 407 (or region of the link) with a lower Co (and higher Lo) between the pair of conductors. However, the relative dimensions of the insulating region 705, disposed between the two plates, reduce the segment 711 of the link (electrical conductor pair) with impedance discontinuity, creating a smaller reflection of a signal, which reduces interference with subsequent bit signals. That is the segment 711 with impedance discontinuity is narrower than a larger cold plate, as illustrated in FIG. 3.

In another embodiment, an electronic system includes a memory subsystem in a first cryogenic temperature domain and a processor in a second cryogenic temperature domain that is lower in temperature than the first cryogenic temperature domain. A flex cable is coupled between the memory subsystem and the processor and the flex cable includes at least one link upon which a signal is carried. The flex cable may include a flexible insulating substrate and the at least one link includes a first conductive trace disposed on the flexible insulating substrate and a second conductive trace disposed on the flexible insulating substrate. The two conductive traces can form a link. Alternatively, the flex cable may include a pair of conductors, such as wires embedded within the flexible insulating substrate, to form a single link. A first segment of the at least one link is in a superconducting state in the second temperature domain and a second segment of the at least one link is in a conducting state in the first temperature domain. A cooling assembly is coupled to the flex cable to thermally clamp the flex cable to the second cryogenic temperature domain. It should be noted that the embodiments herein describes two segments, including a first segment in which most current is carried by superconductive cooper pairs and a second segment in which most current is carried by normally conductive electrons in the conduction band of the metal. It should be noted that there may be a transition region (a third segment) in which the conductor's temperature is changing. The cooling assembly includes an electrical insulator including ceramic material (e.g., Beryllium oxide (BeO), Alumina ($Al_2O_3$), Aluminum Nitride (AlN), or the like). The electrical insulator is coupled to the at least one link. The cooling assembly may also include a cold plate, multiple cold plates, or an orthogonal cold strip, as described herein. In one embodiment, the cooling assembly may include an orthogonal cold strip coupled to an electrical insulator including the ceramic material, where a height of the orthogonal cold strip is orthogonal to a first plane in which the at least one link is disposed and where a total height of the orthogonal cold strip and the electrical insulator is greater than a width of the orthogonal cold strip. In another embodiment, a height of the electrical insulator is greater than the height of the orthogonal cold strip (e.g., copper). In another embodiment, the height of the orthogonal cold strip is greater than a height of the electrical insulator.

In a further embodiment, the at least one link has a combination of copper and niobium and the cooling assembly has a cold plate with a width of the cold plate being greater than a height of the cold plate. In this embodiment, the ceramic material has a lower electrical conductivity than metal (e.g., 385 W/M-K for copper) and a high thermal conductivity 40 watts per meter-kelvin or above (or other thermal conductivities that are comparable to the thermal conductivity of copper).

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this disclosure, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this disclosure and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

The above description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

The description above includes specific terminology and drawing symbols to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multiconductor signal links may alternatively be single-conductor signal links, and single conductor signal links may alternatively be multiconductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or de-asserts, if explicitly stated or indicated by context) the signal on a signal line coupled between the signal driving and signal receiving circuits. A signal line is said to be "activated" when a signal is asserted on the signal line, and "deactivated" when the signal is de-asserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement. While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. An electronic system comprising:
   a first component configured to operate in a first temperature domain;
   a second component configured to store data in a second temperature domain, wherein the second temperature domain is lower in temperature than the first temperature domain;
   an electrical conductor coupled between the first component and the second component along a first plane, wherein the electrical conductor is to carry a signal between the first component and the second component;
   an electrical insulator coupled to a segment of the electrical conductor; and
   an orthogonal cold strip coupled to the electrical insulator, wherein a height of the orthogonal cold strip is orthogonal to a first plane in which the electrical conductor is disposed, and wherein a total height of the orthogonal cold strip and the electrical insulator is greater than a width of the orthogonal cold strip, wherein the first component is a controller and the second component is a memory.

2. The electronic system of claim 1, wherein the electrical conductor comprises a combination of copper and niobium, and wherein the orthogonal cold strip comprises copper.

3. The electronic system of claim 1, wherein the first temperature domain is a first cryogenic temperature and the second temperature domain is a second cryogenic temperature.

4. The electronic system of claim 1, wherein the controller is part of a cryogenic computer and the memory is part of a memory subsystem, wherein the memory subsystem has 0.1 pico-Joules per bit (pJ/b) energy efficiency.

5. The electronic system of claim 1, wherein a height of the electrical insulator is greater than the height of the orthogonal cold strip.

6. The electronic system of claim 1, wherein the height of the orthogonal cold strip is greater than a height of the electrical insulator.

7. The electronic system of claim 1, wherein the electrical insulator and the orthogonal cold strip are configured to thermally clamp the segment at the second temperature domain.

8. An electronic system comprising:
   a memory subsystem configured to store data in a first cryogenic temperature domain;
   a processor configured to operate in a second cryogenic temperature domain that is lower in temperature than the first cryogenic temperature domain;
   a flex cable coupled between the memory subsystem and the processor, the flex cable comprising at least one link upon which a signal is carried, wherein a first segment of the at least one link is in a superconducting state in the second cryogenic temperature domain and a second segment of the at least one link is in a conducting state in the first cryogenic temperature domain; and
   a cooling assembly coupled to the flex cable, the cooling assembly to thermally clamp the flex cable to the second cryogenic temperature domain, wherein the cooling assembly comprises an electrical insulator comprising ceramic material, the electrical insulator coupled to the at least one link.

9. The electronic system of claim 8, wherein the cooling assembly further comprises an orthogonal cold strip coupled to an electrical insulator including the ceramic material, wherein a height of the orthogonal cold strip is orthogonal to a first plane in which the at least one link is disposed, and wherein a total height of the orthogonal cold strip and the electrical insulator is greater than a width of the orthogonal cold strip.

10. The electronic system of claim 9, wherein the orthogonal cold strip comprises copper, wherein the electrical insulator comprises at least one of Beryllium oxide (BeO), Alumina (Al2O3), or Aluminum Nitride (AlN), and wherein the at least one link comprises a combination of copper and niobium.

11. The electronic system of claim 8, wherein the at least one link comprises a combination of copper and niobium, wherein the cooling assembly further comprises a cold plate with a width of the cold plate being greater than a height of the cold plate, and wherein the ceramic material has an electrical conductivity lower than copper and a thermal conductivity above 40 watts per meter-kelvin.

12. The electronic system of claim 11, wherein the ceramic material is at least one of Beryllium oxide (BeO), Alumina (Al2O3), or Aluminum Nitride (AlN).

13. The electronic system of claim 8, wherein the first cryogenic temperature domain is approximately 77 kelvin (77K) or above and the second cryogenic temperature domain is less than 77K.

14. The electronic system of claim 8, wherein the first cryogenic temperature domain is approximately 77 kelvin (77K) and the second cryogenic temperature domain is 4K.

15. The electronic system of claim 8, wherein the flex cable comprises a flexible insulating substrate, wherein the at least one link comprise a first conductive trace disposed on the flexible insulating substrate and a second conductive trace disposed on the flexible insulating substrate.

16. The electronic system of claim 8, wherein the memory subsystem comprises a plurality of Dynamic Random Access Memory (DRAM) devices disposed on a substrate.

17. A cooling assembly comprising:
   an electrical insulator, the electrical insulator to couple to a segment of an electrical conductor that carries a signal between a first component configured to operate in a first temperature domain and a second component configured to store data in a second temperature domain, wherein the second temperature domain is lower in temperature than the first temperature domain, wherein the first component is a controller and the second component is a memory; and an orthogonal cold strip stacked on the electrical insulator, wherein a height of the orthogonal cold strip is orthogonal to a first plane in which the electrical conductor is disposed, and wherein a total height of the orthogonal cold strip and the electrical insulator is greater than a width of the orthogonal cold strip.

18. The cooling assembly of claim 17, wherein the orthogonal cold strip comprises copper, wherein the electrical insulator comprises at least one of Beryllium oxide (BeO), Alumina (Al2O3), or Aluminum Nitride (AlN), and wherein a height of the electrical insulator is greater than the height of the orthogonal cold strip.

19. The cooling assembly of claim 17, wherein the orthogonal cold strip comprises copper, and wherein the height of the orthogonal cold strip is greater than a height of the electrical insulator.

\* \* \* \* \*